US008891296B2

(12) United States Patent
Ma

(10) Patent No.: US 8,891,296 B2
(45) Date of Patent: Nov. 18, 2014

(54) LINEAR PROGRAMMING BASED DECODING FOR MEMORY DEVICES

(71) Applicant: Empire Technology Development LLC, Wilmington, DE (US)

(72) Inventor: Xudong Ma, Monterey Park, CA (US)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 13/997,890

(22) PCT Filed: Feb. 27, 2013

(86) PCT No.: PCT/US2013/027851
§ 371 (c)(1),
(2), (4) Date: Jun. 25, 2013

(87) PCT Pub. No.: WO2014/133490
PCT Pub. Date: Sep. 4, 2014

(65) Prior Publication Data
US 2014/0244905 A1  Aug. 28, 2014

(51) Int. Cl.
*G11C 11/34* (2006.01)
*G11C 16/34* (2006.01)
*G06F 12/02* (2006.01)
(52) U.S. Cl.
CPC ........ *G11C 16/3431* (2013.01); *G06F 12/0246* (2013.01)
USPC ............ 365/185.02; 365/185.18; 365/185.22; 365/185.09
(58) Field of Classification Search
USPC ............ 365/185.18, 185.22, 185.09; 714/763
See application file for complete search history.

(56) References Cited

U.S. PATENT DOCUMENTS

| 5,742,934 | A | 4/1998 | Shinohara |
| 5,873,112 | A | 2/1999 | Norman |
| 6,069,827 | A | 5/2000 | Sinclair |
| 6,492,918 | B1 | 12/2002 | Rezzi et al. |
| 6,933,864 | B1 | 8/2005 | Buch et al. |
| 6,973,613 | B2 | 12/2005 | Cypher |
| 7,065,607 | B2 | 6/2006 | England et al. |
| 7,907,070 | B2 | 3/2011 | Wu et al. |

(Continued)

FOREIGN PATENT DOCUMENTS

| EP | 1424631 | 3/2008 |
| JP | 2002351738 A | 12/2002 |

(Continued)

OTHER PUBLICATIONS

International Search Report and Written Opinion for PCT Application No. PCT/US2013/021168 mailed Mar. 4, 2013.

(Continued)

*Primary Examiner* — Fernando Hidalgo
(74) *Attorney, Agent, or Firm* — Hope Baldauff, LLC

(57) ABSTRACT

Technologies are generally described herein for linear programming based decoding for memory devices. In some examples, a cell threshold voltage level of a memory cell is detected. An interference voltage level of an interference cell that interferes with the memory cell can be determined. The cell threshold voltage level can be decoded in accordance with a set of beliefs to determine the value of the memory cell. The set of beliefs can include a minimization of an objective function of a linear program representing inter-cell interference between the memory cell and the interference cell.

22 Claims, 7 Drawing Sheets

(56) References Cited

U.S. PATENT DOCUMENTS

| | | | |
|---|---|---|---|
| 8,031,526 B1* | 10/2011 | Wu et al. | 365/185.18 |
| 8,085,605 B2 | 12/2011 | Yang et al. | |
| 8,423,867 B2 | 4/2013 | Ma | |
| 8,595,591 B1* | 11/2013 | Shalvi et al. | 714/763 |
| 2003/0086302 A1 | 5/2003 | Kurakata et al. | |
| 2008/0082744 A1 | 4/2008 | Nakagawa | |
| 2008/0294965 A1 | 11/2008 | Ni et al. | |
| 2009/0144512 A1 | 6/2009 | Yoshida | |
| 2010/0070735 A1 | 3/2010 | Chen et al. | |
| 2010/0194607 A1 | 8/2010 | Smith | |
| 2010/0205504 A1 | 8/2010 | Fung | |
| 2011/0107056 A1 | 5/2011 | Kuo | |
| 2011/0141815 A1* | 6/2011 | Haratsch et al. | 365/185.18 |
| 2011/0145487 A1 | 6/2011 | Haratsch et al. | |
| 2011/0216586 A1 | 9/2011 | Graef et al. | |
| 2011/0305082 A1 | 12/2011 | Haratsch et al. | |
| 2012/0110418 A1 | 5/2012 | Ma | |
| 2014/0053043 A1* | 2/2014 | Shalvi et al. | 714/773 |

FOREIGN PATENT DOCUMENTS

| | | |
|---|---|---|
| JP | 2004038971 A | 2/2004 |
| JP | 2008084270 A | 4/2008 |
| JP | 2009116661 A | 5/2009 |
| JP | 2009135854 A | 6/2009 |
| WO | 0180249 A1 | 10/2001 |
| WO | 2010002941 | 1/2010 |
| WO | WO 2010/029411 | 1/2010 |
| WO | WO 2012/023102 | 2/2012 |
| WO | WO 2012/057777 | 5/2012 |

OTHER PUBLICATIONS

International Search Report and Written Opinion for PCT Application No. PCT/US2010/054634 mailed Dec. 14, 2010.

U.S. Office Action dated Jan. 27, 2012 in U.S. Appl. No. 13/059,808.

U.S. Notice of Allowance dated May 21, 2012 in U.S. Appl. No. 13/059,808.

U.S. Notice of Allowance dated Dec. 28, 2012 in U.S. Appl. No. 13/059,808.

Aritome, et al. "Reliability Issues of Flash Memory Cells," May 1993, Proceedings of the IEEE, vol. 81 No. 5.

Olson et al., "Solid State Drives Data Reliability and Lifetime," [http://www.csee.umbc.edu/~squire/images/ssd1.pdf] Apr. 7, 2008, pp. 1-27.

Heegard, C., "Partitioned Linear Block Codes for Computer Memory with 'stuck-at' Defects," IEEE Transactions on Information Theory, vol. 29, No. 6, Nov. 1983, pp. 831-842.

Heegard et al., "On the Capacity of Computer Memory with Defects," IEEE Transactions on Information Theory, vol. 29, No. 5, Sep. 1983, pp. 731-739.

Yaakobi et al., "Error Characterization and Coding Schemes for Flash Memories," pp. 1-5, Proc. Workshop on the Application of Communication Theory to Emerging Memory Technologies, Miami, Florida, Dec. 2010.

Wei et al., "Reliably Erasing Data From Flash-Based Solid State Drives," [http://cseweb.ucsd.edu/users/swanson/papers/Fast2011SecErase.pdf] pp. 1-13, FAST 11 (2011).

Kuznetsov et al., "Coding in a memory with Defective Cells," Probl. Peredachi Inf., 1974, 10:2, 52-60.

International Search Report and Written Opinion for PCT Application No. PCT/US2013/027851 mailed Apr. 30, 2013.

Dong, G., et al., "Using Data Postcompensation and Predistortion to Tolerate Cell-to-Cell Interference in MLC NAND Flash Memory", IEEE Transactions on Circuits and Systems—I: Regular Papers, vol. 57, No. 10, Oct. 2010.

Kudekar, S., et al., "Linear Programming based Detectors for Two-Dimensional Intersymbol Interference Channels", Center for Nonlinear Studies and Theoretical Division T-4, Los Alamos National Laboratory, Los Alamos, NM, USA.

Jiang: A. and Bruck, J, et al, "Joint Coding for Flash Memory Storage," IEEE International Symposium on Information Theory, pp. 1741-1745 (2008).

Jiang, A., et al., "Rewriting Codes for Joint Information Storage in Flash Memories." IEEE Transactions on Information Theory, vol. 56, No. 10, pp. 5300-5313 (2010).

Supplementary European Search Report for European Application No. 10 85 9090, mailed on Feb. 24, 2014.

Zhang, F., et al., "LDPC Codes for Rank Modulation in Flash Memories," IEEE International Symposium on Information Theory, ISIT 2010, pp. 859-863 (2010).

* cited by examiner

LINEAR PROGRAMMING BASED DECODING FOR MEMORY DEVICES

BACKGROUND

Unless otherwise indicated herein, the materials described in this section are not prior art to the claims in this application and are not admitted to be prior art by inclusion in this section.

While demand for higher storage capacity for memory devices has increased, a demand for smaller sized memory devices has similarly increased. Thus, some memory devices have been scaled down to achieve higher storage densities. In the case of flash memory devices, for example, increasing storage densities has resulted in increased challenges from inter-cell interference. To overcome the problem of inter-cell interference, various models for the inter-cell interference have been developed.

Because flash memory cells are sometimes laid out in a grid pattern, however, determining and/or calculating inter-cell interference models may require solving complex problems. In some instances, determining two-dimensional inter-cell interference in a flash memory device may require solution of an NP-hard problem. As a result, use of some inter-cell interference models may be unrealistic and/or may not be useful.

SUMMARY

The present disclosure generally describes concepts and technologies for linear programming based decoding for memory devices. According to various embodiments of the concepts and technologies disclosed herein, data is obtained at a computing device configured to execute a controller for managing writing data to and reading data from a data storage device such as a flash memory device, a phase change memory device, and/or other types of volatile and/or nonvolatile memory devices (hereinafter referred to as "memory devices"). During writing of the data to memory cells of the memory device, some cells can experience migration charges and/or voltage level shifts caused during alteration of voltage levels of neighboring cells.

The controller and/or the computing device can be configured to read data from the memory device, taking into account expected voltage shifts and/or voltage migrations. According to various embodiments, the computing device also can be configured to identify a cell to be read, detect a cell threshold value level for the cell, and identify interference cells. The computing device also can determine interference voltage levels of the interference cells and decode the cell threshold voltage level of the read cell based upon a set of beliefs determined and/or known for the memory device.

According to some embodiments, the computing device can be configured to determine the set of beliefs for a memory device by modeling the inter-cell interference between the cell and the interference cells as an integer programming problem. The computing device can relax the integer programming problem to obtain a linear program, and solve the linear program to obtain a set of beliefs that minimizes the linear program. The computing device can be configured to decode the cell threshold voltage level in accordance with the set of beliefs.

According to one aspect, a method for determining a value of a memory cell of a flash memory device is disclosed. The method can include detecting a cell threshold voltage level of the memory cell, determining an interference voltage level of an interference cell that interferes with the memory cell, and decoding the cell threshold voltage level in accordance with a set of beliefs to determine the value of the memory cell. The set of beliefs can include a minimization of an objective function of a linear program representing inter-cell interference between the memory cell and the interference cell.

According to some embodiments, the set of beliefs can include a set of marginal probabilities satisfying a constraint associated with the linear program. The method also can include receiving a model representing inter-cell interferences associated with two or more cells of the flash memory device. The model can include the set of beliefs. In some embodiments, the set of beliefs can be obtained by modeling the inter-cell interference between the memory cell and the interference cell as an integer programming problem, relaxing the integer programming problem to obtain the linear program, and solving the linear program to obtain the set of beliefs. The method also can include identifying, for two or more signals written to two or more cells of the flash memory device, resulting threshold voltage values, and determining, based upon the resulting threshold values, a configuration of writing to the two or more cells. The configuration can be a configuration that minimizes a Euclidean distance between the resulting threshold voltage values of the two or more cells and measured threshold voltage levels of the two or more cells.

In some embodiments, the method also can include determining an integer programming problem that represents the Euclidean distance between the resulting threshold voltage values and measured threshold voltage levels of the two or more cells, relaxing the integer programming problem to obtain a linear programming problem, and identifying the set of beliefs. The set of beliefs can correspond to a set of marginal probabilities that minimizes the linear programming problem. Detecting the cell threshold voltage level can include detecting the cell threshold voltage level in response to receiving a request to read the value of the memory cell. Decoding the cell threshold voltage level in accordance with the set of beliefs to determine the value of the memory cell can include compensating for the inter-cell interference between the memory cell and the interference cell by multiplying the cell threshold voltage level by a marginal probability corresponding to at least one of the set of beliefs, and determining the value of the memory cell according to a result of multiplying the cell threshold voltage level by the marginal probability.

In some embodiments, decoding the cell threshold voltage level in accordance with the set of beliefs to determine the value of the memory cell can include compensating for the inter-cell interference between the memory cell and the interference cell by multiplying the cell threshold voltage level by a marginal probability corresponding to at least one of the set of beliefs, determining a probability that the value of the memory cell is equal to zero, and determining a further probability that the value of the memory cell is equal to one. The probability can be compared to the further probability. In response to a determination that the probability is greater than the further probability, the value of the memory cell can be determined to be zero. In response to a determination that the further probability is greater than the probability, the value of the memory cell can be determined to be one.

According to another aspect, a computer readable medium is disclosed. The computer readable medium can include computer executable instructions that, when executed by a computer, cause the computer to detect a cell threshold voltage level of a memory cell of a flash memory device, determine an interference voltage level of an interference cell that interferes with the memory cell, and decode the cell threshold voltage level in accordance with a set of beliefs to determine a value of the memory cell. The set of beliefs can include a minimization of an objective function of a linear program representing inter-cell interference between the memory cell and the interference cell.

According to some embodiments, the computer readable medium further includes computer executable instructions that, when executed by the computer, cause the computer to receive a model that represents inter-cell interferences between two or more cells of the flash memory device. The model can include the set of beliefs. The set of beliefs can include a set of marginal probabilities that satisfies a constraint associated with the linear program. In some embodiments, to obtain the set of beliefs, the computer executable instructions, when executed by the computer, further cause the computer to model the inter-cell interference between the memory cell and the interference cell as an integer programming problem, relax the integer programming problem to obtain the linear program, and solve the linear program to obtain the set of beliefs.

In some embodiments, the computer readable medium further includes computer executable instructions that, when executed by the computer, further cause the computer to identify, for two or more signals written to two or more cells of the flash memory device, resulting threshold voltage values and measured threshold voltage levels, and determine, based upon the resulting threshold voltage values, a configuration of writing to the two or more cells. The configuration can minimize a Euclidean distance between the the resulting threshold voltage values and the measured threshold voltage levels. The computer readable medium further can include computer executable instructions that, when executed by the computer, further cause the computer to determine an integer programming problem that represents the Euclidean distance between the resulting threshold values and the measured threshold voltage levels, relax the integer programming problem to obtain a linear programming problem, and identify the set of beliefs. The set of beliefs can correspond to a set of marginal probabilities that minimizes the linear programming problem.

In some embodiments, to detect the cell threshold voltage level, the computer executable instructions, when executed by the computer, can further cause the computer to detect the cell threshold voltage level in response to a request to read the value of the memory cell. To decode the cell threshold voltage level in accordance with the set of beliefs to determine the value of the memory cell, the computer executable instructions, when executed by the computer, can further cause the computer to multiply the cell threshold voltage level by a marginal probability corresponding to at least one of the set of beliefs to compensate for the inter-cell interference between the memory cell and the interference cell, and determine the value of the memory cell according to a result of multiplying the cell threshold voltage level by the marginal probability.

In some embodiments, to decode the cell threshold voltage level in accordance with the set of beliefs to determine the value of the memory cell, the computer executable instructions, when executed by the computer, can further cause the computer to multiply the cell threshold voltage level by a marginal probability corresponding to at least one of the set of beliefs to compensate for the inter-cell interference between the memory cell and the interference cell, determine a probability that the value of the memory cell is equal to zero, and determine a further probability that the value of the memory cell is equal to one. The probability can be compared to the further probability. In response to a determination that the probability is greater than the further probability, the value of the memory cell can be determined to be zero. In response to a determination that the further probability is greater than the probability, the value of the memory cell can be determined to be one.

According to another aspect, a computing device is disclosed. The computing device can include a flash memory device including two or more cells, and a processor coupled to the flash memory device. The processor can be configured to execute computer executable instructions to receive a request to read a value of a memory cell of the flash memory device, and obtain a mathematical model that represents inter-cell interferences of the two or more cells. The model can include a set of marginal probabilities that satisfies constraints associated with the mathematical model. The processor also can be configured to execute the computer executable instructions to detect a cell threshold voltage level of the memory cell, determine, based upon the mathematical model, an interference voltage level of an interference cell that interferes with the memory cell, and decode the cell threshold voltage level in accordance with the set of marginal probabilities to determine the value of the memory cell. The set of marginal probabilities can include a minimization of an objective function of a linear program representing the inter-cell interferences.

In some embodiments, the processor can be further configured to execute the computer executable instructions to generate the mathematical model as an integer programming problem, relax the integer programming problem to obtain the linear program, and solve the linear program to obtain the set of marginal probabilities that minimize the linear program. The processor can be further configured to execute the computer executable instructions to identify, for two or more signals written to the two or more cells of the flash memory device, resulting threshold voltage values and measured threshold voltage levels, and determine, based upon the resulting threshold values, a configuration of writing to the two or more cells. The configuration can minimize a Euclidean distance between the resulting threshold voltage values and the measured threshold voltage levels. The processor can be further configured to generate the mathematical model based, at least partially, upon the Euclidean distance. In some embodiments, the processor can be further configured to execute the computer executable instructions to determine an integer programming problem that represents the Euclidean distance between the resulting threshold values and the measured threshold voltage levels, relax the integer programming problem to obtain a linear programming problem, and identify the set of marginal probabilities. The set of marginal probabilities can correspond to a set of marginal probabilities that minimizes the linear programming problem.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
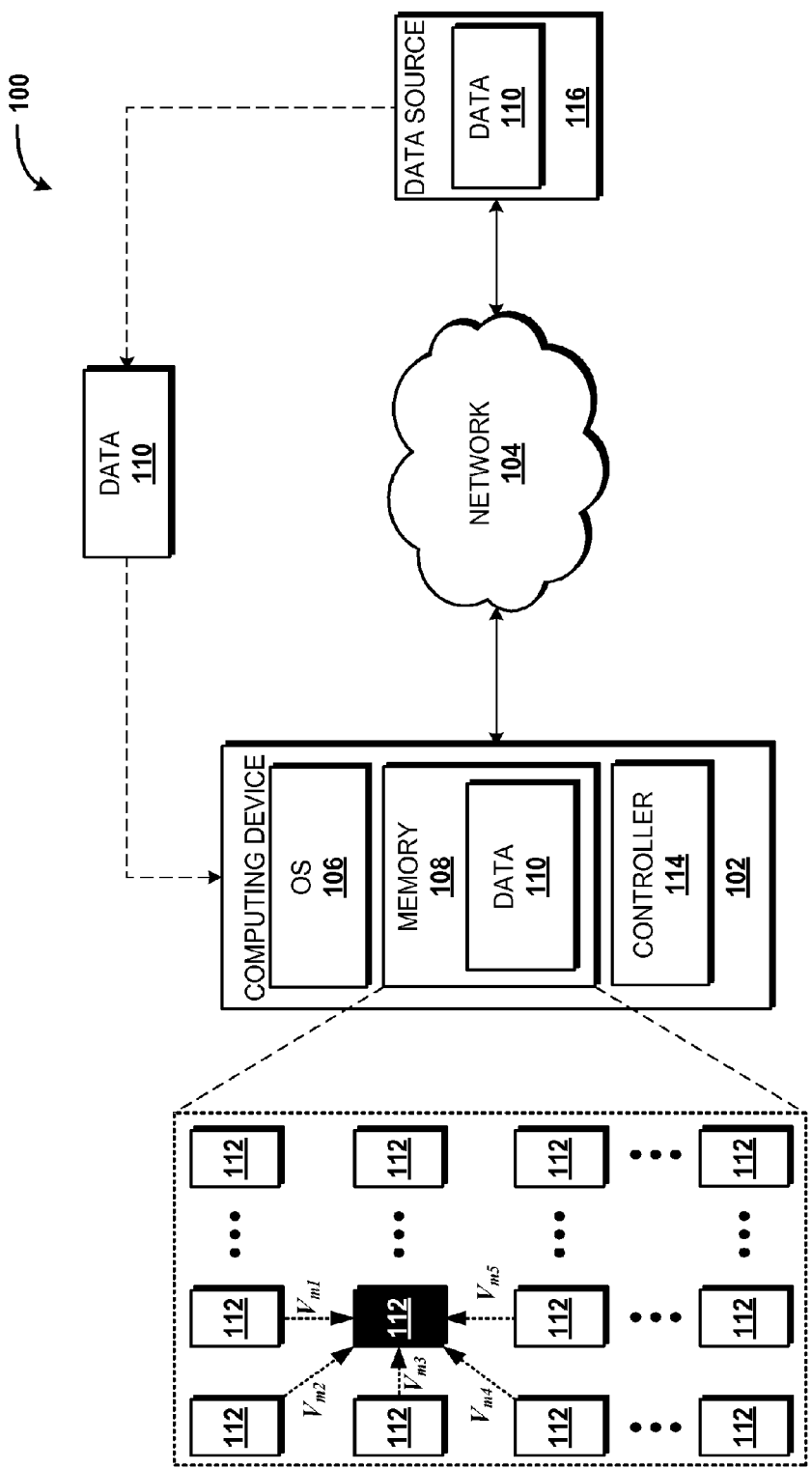
FIG. 1 is a block diagram illustrating an operating environment for various embodiments of the concepts and technologies disclosed herein for linear programming based decoding for memory devices.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the FIGURES, can be arranged, substituted, combined, separated, and designed in a wide variety of different configurations, all of which are explicitly contemplated herein.

This disclosure is generally drawn, inter alia, to technologies for linear programming based decoding for memory devices. In an illustrative example, a computing device, controller, or other hardware and/or software can be configured to read data from a cell of a memory that may experience interference from one or more interference cells. One or more interference cells associated with the read cell can be identified, and threshold voltage levels associated with the read cell and the one or more interference cells can be determined. Inter-cell interference between the one or more interference cells and the read cell can be determined, modeled, and used to decode the threshold voltage level read from the read cell.

In some implementations, the inter-cell interference can be modeled as an integer programming problem. The integer programming problem can be relaxed to obtain a linear programming problem, and the linear programming problem can be solved to obtain a set of beliefs and/or probabilities that can minimize or otherwise can optimize the linear programming problem. The identified set of beliefs can be used to decode the threshold voltage level of the read cell. These and other aspects of systems and methods for linear programming based decoding for memory devices will be described in more detail herein.

FIG. 1 is a block diagram illustrating an operating environment 100 for various embodiments of the concepts and technologies disclosed herein for linear programming based decoding for memory devices, arranged in accordance with at least some embodiments presented herein. The operating environment 100 shown in FIG. 1 includes a computing device 102. In some embodiments, the computing device 102 operates as a part of and/or in communication with a communications network ("network") 104, though this is not necessarily the case. According to various embodiments, the functionality of the computing device 102 can be provided by a personal computer ("PC") such as a desktop computer, a tablet computer, and/or a laptop computer. In some other embodiments, the functionality of the computing device 102 can be provided by other types of computing systems including, but not limited to, server computers, handheld computers, netbook computers, embedded computer systems, personal digital assistants, mobile telephones, smartphones, other computing devices, combinations thereof, or the like.

The computing device 102 can be configured to execute an operating system 106 and one or more application programs (not illustrated). The operating system 106 can include a computer program for controlling the operation of the computing device 102. The application programs can include various executable programs configured to execute on top of the operating system 106 to provide functionality associated with the computing device 102. For example, the application programs can include programs for providing various functions associated with the computing device 102 such as, for example, multimedia application programs, web browser application programs, messaging application programs, productivity application programs, and/or other application programs. It should be understood that these examples of application programs are illustrative, and should not be construed as being limiting in any way.

The computing device 102 also can include a data storage device (hereinafter referred to as a "memory") 108. The functionality of the memory 108 can be provided by one or more volatile and/or non-volatile memory devices including, but not limited to, a flash memory device, a phase-change memory device, a hard disk drive, and/or other memory storage devices. In some implementations of the computing device 102, the functionality of the memory 108 can be provided by a flash memory device. Because the functionality of the memory 108 can be provided by additional and/or alternative types of data storage devices, it should be understood that this embodiment is illustrative, and should not be construed as being limiting in any way. Furthermore, it should be understood that the memory 108 can be configured as a removable and/or non-removable memory device. As such, while the memory 108 is illustrated as a component of the computing device 102, it should be understood that the memory 108 can be removed from the computing device 102 at various times and/or for various reasons.

The computing device 102 can be configured to store data 110 in the memory 108. According to various implementations, the computing device 102 can be configured to store the data 110 in the memory 108 by altering voltages of one or more memory cells (hereinafter referred to as "cells") 112 of the memory 108. According to various implementations of the memory 108, the memory 108 can include hundreds, thousands, or even millions of cells 112. In some embodiments, the cells 112 can be arranged in a grid structure that includes one or more rows and/or one or more columns of the cells 112. One example embodiment of the memory 108 and cells 112 thereof is illustrated and described below with reference to FIG. 2. Briefly, a row of the cells 112 may correspond to a word line, and a column of the cells 112 may correspond to a bit line, though this is not necessarily the case.

A memory 108 can include hundreds, thousands, or even millions of word lines and/or bit lines.

According to various embodiments of the concepts and technologies described herein, the computing device 102 can be configured to include, to execute, and/or to access a controller 114 that can be configured to manage various processes described herein for reading and/or decoding the data 110 stored in the memory 108. According to some embodiments of the concepts and technologies described herein, the controller 114 can be provided by a hardware controller. According to some other embodiments of the concepts and technologies described herein, the controller 114 can be provided by a software application or module executed by the computing device 102. According to some other embodiments, the controller 114 can be provided as a part of the operating system 106. For purposes of describing and illustrating the concepts and technologies described herein for linear programming based decoding for memory devices, the controller 114 is described herein as a software module executed by the computing device 102 as part of the operating system 106 or as a separate application program. In light of the above variations described above, it should be understood that this example is illustrative, and should not be construed as being limiting in any way. The functionality of the controller 114 is described in further detail below.

The computing device 102 can be configured to access and/or receive the data 110 from various sources. In some embodiments, the data 110 can be generated by the computing device 102 and stored in the memory 108. In some other embodiments, the data 110 can be obtained from a data source 116 that can be configured to operate as a part of and/or in communication with the network 104. According to various implementations, the functionality of the data source 116 can be provided by a network hard drive, a server computer, a data store, and/or other real or virtual devices.

According to various embodiments, the computing device 102 can be configured to write the data 110 to the memory 108. The computing device 102 also can be configured to execute the controller 114 to read and/or decode the data 110 stored in the memory 108. In particular, as will be explained below in more detail, particularly with reference to FIGS. 3-5, the computing device 102 can be configured to execute the controller 114 to read and decode the data 110 stored in the memory 108.

According to some embodiments of the concepts and technologies disclosed herein, the controller 114 can be configured to identify a cell 112 of the memory 108 that is to be read. The selection of the cell 112 by the controller 114 can be based upon various considerations. For example, the controller 114 can select the cell 112 to be read based upon a read request received by the computing device 102 and/or the controller 114. Additionally, or alternatively, the controller 114 can be configured to select the cell 112 to be read based upon known properties of the memory 108. Because the controller 114 can select the cell 112 in additional and/or alternative ways, it should be understood that these examples are illustrative, and should not be construed as being limiting in any way. The controller 114 can read a cell threshold voltage level of the selected cell 112.

The controller 114 also can identify an interference cell 112 associated with the selected cell 112. In particular, the controller 114 can be configured to identify interference cells 112 for a particular selected or read cell 112 based upon known properties of the memory 108. Thus, for example, the controller 114 can store and/or access data that indicates a known layout and/or properties of the memory 108 that can be used by the controller 114 to identify interference cells 112 for the selected cell. The controller 114 can identify the interference cell 112, and read an interference voltage level of the interference cell 112. The phrase "interference voltage level" of the interference cell 112 can be used herein to refer to a threshold voltage level of the interference cell 112. As will be explained in more detail herein, the threshold voltage level of the interference cell 112 can be a component or consideration in a function that can be used to decode a value of the read cell 112. Thus, the interference voltage level can correspond and/or or be used to determine a known or expected effect on a voltage level of a read cell 112 from the interference cell 112.

In the embodiment shown in FIG. 1, a read cell 112 is shown as a black cell with white text. As shown in FIG. 1, the read cell 112 can experience a voltage level shift during a write process affecting a neighboring or nearby cell 112. This is illustrated in FIG. 1 by showing that the read cell 112 can be affected by a voltage leaks or voltage migrations $V_{m1-5}$ (hereinafter collectively and/or generically referred to as "voltage migrations $V_m$") from none, one, or more than one of the neighboring cells 112. While the read cell 112 is illustrated in FIG. 1 as being affected by voltage migration $V_m$ from five neighboring cells 112, it should be understood a voltage shift at the read cell 112 can be caused by a single interference cell 112. Furthermore, it should be understood that each interference cell 112 may have an associated voltage migration $V_m$ that, compared to other voltage migrations $V_m$ of other interference cells 112, can be equal and/or can be unequal. Furthermore, any number of interference cells 112 may exist for a particular read cell 112. As such, the illustrated embodiment should be understood as being illustrative and should not be construed as being limiting in any way.

According to various embodiments, the controller 114 can determine interference voltages associated with the one or more interference cells 112. Furthermore, the controller 114 can be configured to generate and/or apply a known or expected set of beliefs that can define a relationship between an interference voltage of an interference cell 112 and a value of a read cell 112. Thus, the controller 114 can be configured to determine an affect the interference cells 112 have on a read cell 112, thereby identifying the expected voltage shift experienced at the read cell 112 as a result of the interference cells 112. In some embodiments, the value of a read cell 112 can correspond to a function of the threshold voltage level of the read cell 112 and an interference voltage of an interference cell 112. It should be understood that this example is illustrative, and should not be construed as being limiting in any way.

Using the expected interference voltage levels, the controller 114 can decode the detected cell threshold voltage level of the read cell 112. Thus, the controller 114 can identify the voltage shift and correct for the voltage shift to determine the value of the read cell. It should be understood that in some embodiments, the set of beliefs associated with a particular memory 108 may be known. In some other embodiments, the controller 114 can be configured to determine the set of beliefs, as is explained below.

According to some embodiments of the concepts and technologies disclosed herein, the controller 114 and/or the computing device 102 can be configured to obtain a set of beliefs for a particular memory 108 and/or array of cells 112. The set of beliefs can be used to decode cell threshold voltage levels of cells as mentioned above. The set of beliefs can be generated and/or known for a particular memory 108.

In some embodiments, the computing device can model the inter-cell interference for a particular memory 108 as an integer programming problem. The modeling can occur at various times. In some embodiments, the modeling can occur after receiving a read request. The computing device 102 can formulate an integer programming problem, relax the integer program problem into a linear program to minimize an objective function of the linear program and thereby obtain a set of beliefs, and decode the cell 112 being read according to the beliefs. These and other aspects of the concepts and technologies disclosed herein for linear programming based decoding for memory devices will be explained in more detail below.

FIG. 1 illustrates one computing device 102, one memory 108, one controller 114, and one data source 116. It should be understood, however, that some implementations of the operating environment 100 include multiple computing devices 102, multiple memories 108, multiple controllers 114, and/or zero or multiple data sources 116. Thus, the illustrated embodiment of the operating environment 100 should be understood as being illustrative of one embodiment thereof and should not be construed as being limiting in any way.

Figure 2:
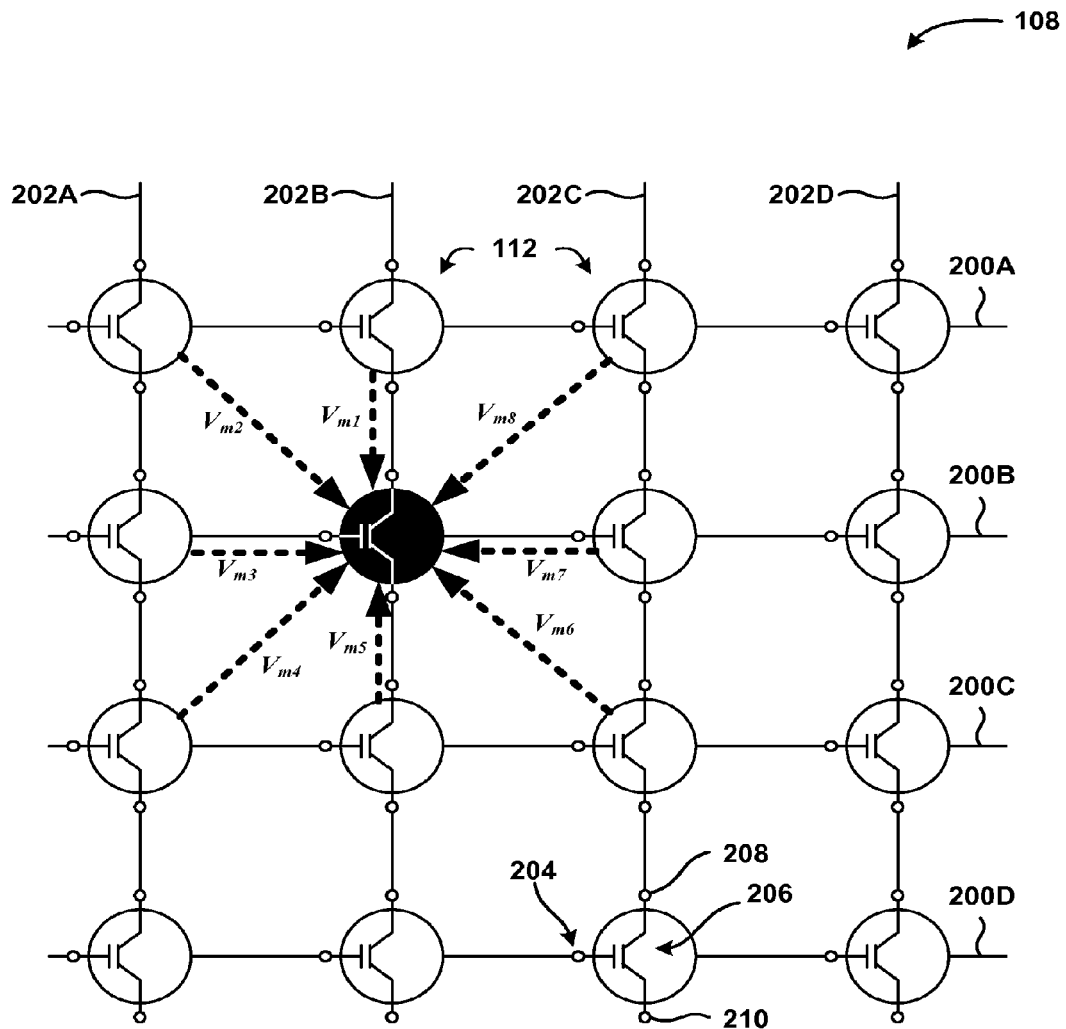
FIG. 2 is a line diagram illustrating an example memory device for various embodiments of the concepts and technologies disclosed herein for linear programming based decoding for memory devices.

Turning now to FIG. 2, a line diagram illustrating an example memory device for various embodiments of the concepts and technologies disclosed herein for linear programming based decoding for memory devices, arranged according to at least some embodiments presented herein, will be described. FIG. 2 illustrates an example memory device such as the memory 108 illustrated and described herein. It should be understood that the illustration of FIG. 2 can correspond to only a portion of the memory 108 shown in FIG. 1.

The memory 108 can include word lines 200A-D (hereinafter collectively and/or generically referred to as "word lines 200"), which can correspond to the rows of the cells 112 mentioned above with reference to FIG. 1. Additionally shown in FIG. 2 are bit lines 202A-D (hereinafter collectively and/or generically referred to as "bit lines 202"). As shown in FIG. 2, some embodiments of the memory 108 include an array of cells 112, wherein one or more of the cells 112 can include a control gate 204, a floating gate 206, a source 208, and a drain 210. According to some implementations of the memory 108, control gates 204 of cells 112 that lie in a same row can be connected to a same word line 200. Similarly, sources 208 and drains 210 of cells 112 that lie in a same column can be connected to a same bit line 202. It should be understood that the cells 112 of the memory 108 shown in FIG. 2 can correspond to one contemplated example of the cells 112 and therefore should not be construed as being limiting in any way.

During a write process at the computing device 102, the computing device 102, and/or a controller 114 and/or other components of the computing device 102, can write the data 110 to the memory 108 by modifying threshold voltage levels of the cells 112. In particular, the computing device 102 can be configured to inject electrons into the floating gates 206 of the cells 112. Due to a parasitic capacitance-coupling effect that sometimes can be experienced within the memory 108, voltage levels of the control gates 206, sources 208, and drains 210 of neighboring cells 112 can be disturbed during writing of a cell 112, as explained above with reference to FIG. 1. Thus, a particular cell 112 can experience a voltage shift from one or more neighboring cells 112. Voltage migration $V_m$ is shown in FIG. 2, assuming that each cell 112 that borders the read cell 112, illustrated with dark shading in FIG. 2, has been written. It should be understood that zero, one, or more than one cell 112 may be written, and therefore the illustration of FIG. 2 is illustrative and should not be construed as being limiting in any way. Various aspects of identifying, modeling, and/or using inter-cell interference models to decode values of cells 112 will be illustrated and described in more detail below.

Figure 3:
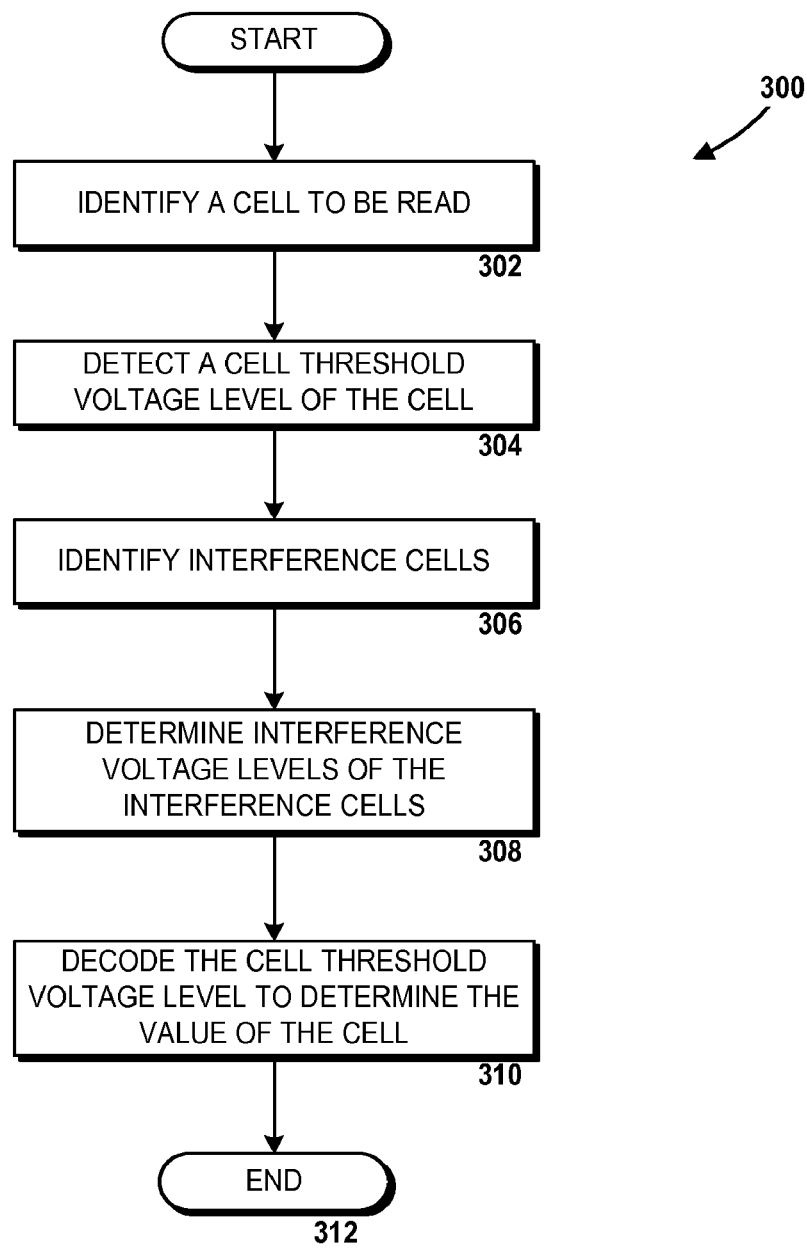
FIG. 3 is a flow diagram illustrating an example process for determining a value of a memory cell.

Turning now to FIG. 3, a flow diagram illustrating an example process 300 for determining a value of a memory cell, arranged according to at least some embodiments presented herein, will be described. It should be understood that the operations of the processes described herein are not necessarily presented in any particular order and that performance of some or all of the operations in an alternative order(s) is possible and is contemplated. The operations have been presented in the demonstrated order for ease of description and illustration. Operations may be added, omitted, and/or performed simultaneously, without departing from the scope of the appended claims.

It also should be understood that the illustrated processes can be ended at any time and need not be performed in its entirety. Some or all operations of the processes, and/or substantially equivalent operations, can be performed by execution of computer-readable instructions included on a computer storage media, as defined herein. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or the like.

For purposes of illustrating and describing the concepts of the present disclosure, the process 300 is described as being performed by the computing device 102. It should be understood that this embodiment is illustrative, and should not be viewed as being limiting in any way. Furthermore, as explained above with reference to FIG. 1, the computing device 102 can be configured to execute one or more applications, program modules, or other instructions including, but not limited to, the controller 114 to provide the functionality described herein.

The process 300 may begin at block 302 (IDENTIFY A CELL TO BE READ), wherein the computing device 102 may be configured to identify a cell 112 that is to be read. According to various implementations, the computing device 102 can identify the cell 112 that is to be read based upon a read request that specifies particular data and/or cells 112 to be read, based upon a configuration of the memory 108, and/or based upon additional and/or alternative considerations. Thus, although not explicitly illustrated in FIG. 3, it should be understood that the computing device 102 may be configured to receive a read request in block 302 and identify a cell 112 to be read based, at least partially, upon the read request. Because the cell 112 to be read can be identified and/or selected in additional and/or alternative manners, it should be understood that this example is illustrative, and should not be construed as being limiting in any way. Block 302 may be followed by block 304.

At block 304 (DETECT A CELL THRESHOLD VOLTAGE LEVEL OF THE CELL), the computing device 102 may be configured to detect (e.g., measure) a cell threshold voltage level of the cell 112 identified and/or selected as described with reference to block 302. Because detecting and/or measuring a cell threshold voltage level of a cell 112 of a memory 108 is generally understood, additional details of detecting or measuring the cell threshold voltage level of the cell 112 will not be described in further detail with reference to block 304. Block 304 may be followed by block 306.

At block 306 (IDENTIFY INTERFERENCE CELLS), the computing device 102 may be configured to identify one or more interference cells 112. The computing device 102 can be configured to identify the one or more interference cells 112 based upon a known structure and/or properties of the memory 108, based upon a known write order associated with the memory 108, other known and/or determined characteristics of the memory 108, combinations thereof, or the like. Thus, the functionality of the computing device 102 illustrated with respect to block 306 of the process 300 can correspond to determining, identifying, and/or obtaining data indicating one or more interference cells 112, though this is not necessarily the case. Block 306 may be followed by block 308.

At block 308 (DETERMINE INTERFERENCE VOLTAGE LEVELS OF THE INTERFERENCE CELLS), the computing device 102 may be configured to determine interference voltage levels of the interference cells 112. As used herein, the phrase "interference voltage" can be used to refer to a threshold voltage level of a cell 112 identified as an interference cell 112. As such, the functionality of the computing device 102 illustrated with respect to block 308 can correspond to the computing device 102 being configured to determine threshold voltage levels of the interference cells 112. Thus, it should be appreciated that the computing device 102 may be configured, via execution of the functionality illustrated in blocks 304-308, read the threshold voltage levels of the cell 112 identified in block 302 and the interference cells 112 identified in block 306. Block 308 may be followed by block 310.

At block 310 (DECODE THE CELL THRESHOLD VOLTAGE LEVEL TO DETERMINE THE VALUE OF THE CELL), the computing device 102 may be configured to decode the value of the cell 112 identified by the computing device 102 in block 302. According to various implementations, the computing device 102 can be configured to decode the cell threshold voltage level detected in block 304 based, at least partially, upon the one or more interference voltage levels determined in operation 308. In particular, the value of the read cell 112 can be a function of various data including, but not limited to, the threshold voltage level of the cell 112 and threshold voltage levels of interference cells 112. One example process for decoding the cell threshold voltage level based upon interference voltage levels is illustrated and described below with reference to FIG. 4. Because the cell threshold voltage level can be decoded in additional and/or alternative manners, it should be understood that this example process is illustrative, and should not be construed as being limiting in any way. Block 310 may be followed by block 312.

At block 312 (END), the computing device 102 can be configured to terminate execution of the process 300. The computing device 102 also may be configured to repeat (e.g., periodically, continuously, or on-demand) the process 300 by returning to block 302 from block 310, though this is not explicitly shown in FIG. 3. As such, some embodiments of the process 300 can return to block 302 from block 312. Similarly, the computing device 102 may be configured to terminate the process 300 at any time, as noted above.

Figure 4:
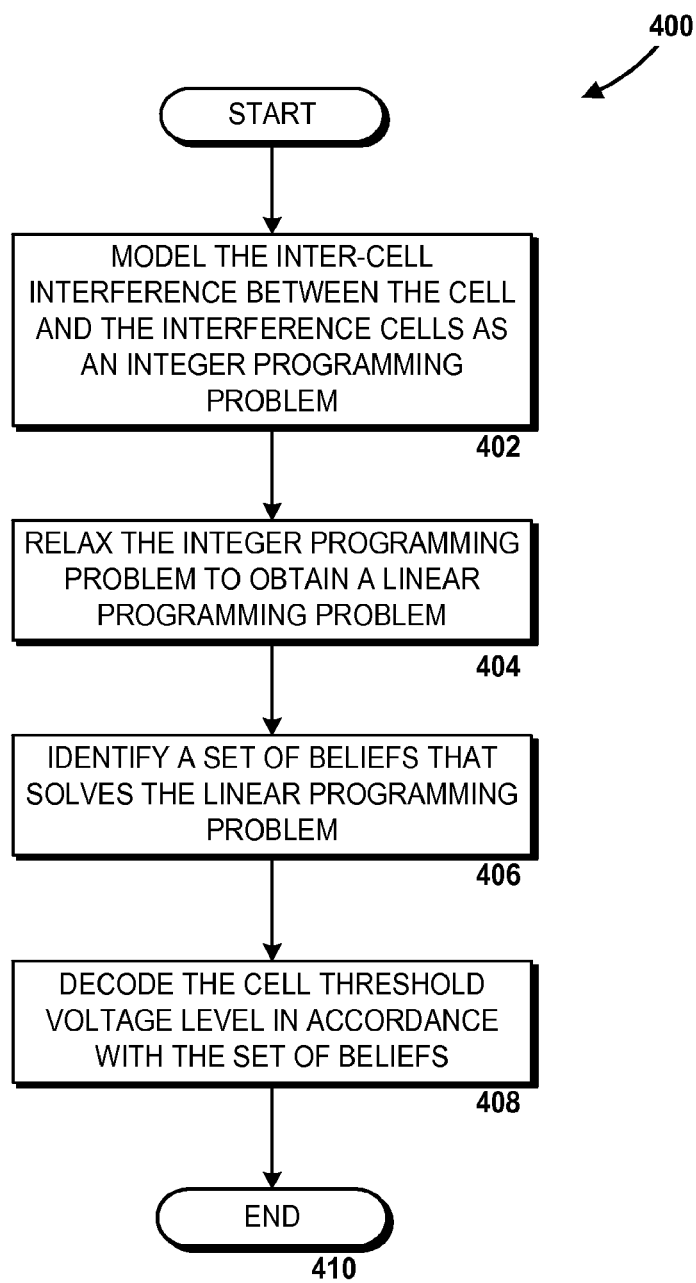
FIG. 4 is a flow diagram illustrating an example process for determining a set of beliefs for use in determining a value of a memory cell.

Turning now to FIG. 4, a flow diagram illustrating an example process 400 for determining a set of beliefs for use in determining a value of a memory cell, arranged according to at least some embodiments presented herein, will be described. The process 400 may begin at block 402 (MODEL THE INTER-CELL INTERFERENCE BETWEEN THE CELL AND THE INTERFERENCE CELLS AS AN INTEGER PROGRAMMING PROBLEM), wherein the computing device 102 may be configured to generate a model that models, simulates, or represents the inter-cell interference between the cell 112 that is being read, and one or more interference cells 112. It can be appreciated with reference to the process 300 described above that the model generated in block 402 can model inter-cell interference between the cell 112 identified in operation 302 and the one or more interference cells 112 identified in block 306. It should be understood that this example is illustrative, and should not be construed as being limiting in any way.

According to various embodiments of the concepts and technologies disclosed herein, the model generated in block 402 can correspond to an integer programming problem. This integer programming problem can represent an effect on a victim cell (the cell 112 being read) by one or more interference cells 112. In some embodiments, as explained above with reference to FIG. 3, this integer programming problem can express an inter-cell interference from a j-th (interference) cell 112 to an i-th (victim or read) cell 112 as $Y(i)=X(i)+\Sigma_j h(i,j)X(j)$, wherein $Y(i)$ can denote the threshold voltage level of the i-th memory cell 112, $X(i)$ can denote the signal written to the i-th cell 112, $h(i,j)$ can denote a coupling ratio between the i-th cell 112 and the j-th interference cell 112, and $X(j)$ can denote the signal written to the j-th interference cell 112. Thus, it again can be appreciated that the value of the read cell 112 can be related to a threshold voltage level of any number of interference cells 112. As such, it can be appreciated that the summation included in the model generated in block 402 can represent interference from any number of interference cells 112 experienced by the read or victim cell 112.

In various implementations of the concepts and technologies disclosed herein, the computing system 102 can be configured to identify a configuration of $X(i)$ such that the corresponding resulting threshold voltage levels $Y(i)$ have a smallest Euclidean distance to the measured threshold voltage levels. If $Z(i)$ is used to represent the measured threshold voltage level of an i-th memory cell 112, the square of the Euclidean distance may be expressed as $\Sigma_i(X(i)+\Sigma_j h(i,j)X(j)-Z(i))^2$. Thus, if a block decoding approach to reducing reading errors is used, the result may be a configuration of $X(i)$ such that the above Euclidean distance can be minimized.

It can be appreciated that a signal written to a particular memory cell 112 may be a Boolean variable, e.g., a zero (0) or a one (1). Thus, according to various implementations, the computing device 102 may be configured to determine that the square of $X(i)$ may be equal to $X(i)$. Similarly, the computing device 102 may be configured to determine that the square of $Z(i)$ also may be a constant number. In light of these determinations, the computing device 102 can be configured to reformulate the Euclidean distance expressed above as an integer programming problem.

In particular, the computing device 102 can be configured to express the Euclidean distance as $\min_{X(i)} \Sigma_i \Sigma_j b(i,j)X(i)X(j)+\Sigma_i a(i)X(i)$, subject to $X(i) \in \{0,1\}$, where $a(i)$ and $b(i,j)$ can be constants that may be determined by $h(i,j)$ and $Z(i)$. The computing device 102 also may be configured to determine that integer programming problems are NP-complete and to solve the above linear programming problem as a linear relaxation problem instead, as will be explained below with reference to block 404. Block 402 may be followed by block 404.

At block 404 (RELAX THE INTEGER PROGRAMMING PROBLEM TO OBTAIN A LINEAR PROGRAMMING PROBLEM), the computing device 102 can be configured to relax the linear programming problem that represents the Euclidean distance to obtain a linear programming problem. In some embodiments, the computing device 102 can relax the integer programming problem. As such, the computing device 102 can be configured to reformulate the linear programming problem as $\min_{X(i)} \Sigma_i \Sigma_j \Sigma_{X(i),X(j)} b(i,j)X(i)X(j)p(X(i),X(j))+\Sigma_i \Sigma_{X(i)} a(i)X(i)p(X(i))$, subject to $\Sigma_{X(i),X(j)} p$ $(X(i),X(j))=1$, $p(X(i))=\Sigma_{X(j)}p(X(i),X(j))$, $p(X(j))=\Sigma_{X(i)}p(X(i),X(j))$, $0 \leq p(x(i)) \leq 1$, and $0 \leq p(x(i),X(j)) \leq 1$, subject to $X(i) \in \{0,1\}$. Block 404 may be followed by block 406.

At block 406 (IDENTIFY A SET OF BELIEFS THAT SOLVES THE LINEAR PROGRAMMING PROBLEM), the computing device 102 can be configured to solve the linear programming problem developed in block 404 to identify a set of beliefs that solves the linear program. In particular, the computing device 102 can be configured to determine that the probabilities $p(X(i))$ and $p(X(i),X(j))$ identified in block 404 are a set of beliefs. As used herein, a "set of beliefs" can include a set of marginal probabilities that satisfy certain marginal probability consistent constraints associated with the linear programming problem. For example, the marginalization of $p(X(i),X(j))$ can be equal to $p(X(i))$, or the like. As such, the computing device 102 can be configured to determine that the linear programming problem developed in block 404 can correspond to an optimization problem of the integer programming problem generated in block 402. Block 406 may be followed by block 408.

At block 408 (DECODE THE CELL THRESHOLD VOLTAGE LEVEL IN ACCORDANCE WITH THE SET OF BELIEFS), the computing device 102 can be configured to decode a cell, for example the cell 112 identified in block 302 of the process 300, according to the set of beliefs obtained in block 406. Thus, the computing device 102 can be configured to determine that a decoded signal or bit (e.g., $X(i)$) is to be decoded as a one (1) if the probability that the decoded signal or bit is equal to one (e.g., $X(i)=1$) exceeds or is greater than a probability that the decoded signal or bit is equal to zero (e.g., $X(i)=0$). As such, the computing device 102 can be configured to determine a probability that the value of decoded cell 112 is equal to zero and determine a probability that the value of the decoded cell 112 is equal to one. The computing device 102 can compare these two probabilities to one another and determine the value of the cell 112 based upon the comparison. In particular, if the computing device 102 determines that the probability that the value of the decoded cell 112 is equal to one exceeds or is greater than probability that the value of the decoded cell 112 is equal to zero, the computing device 112 can be configured to determine that the value of the cell 112 is equal to one. If the computing device 102 determines that the probability that the value of the decoded cell 112 is equal to zero exceeds or is greater than probability that the value of the decoded cell 112 is equal to one, the computing device 112 can be configured to determine that the value of the cell 112 is equal to zero. Thus, the computing device 102 can be configured to determine that $X(i)=1$ if $p(X(i)=1) > p(X(i)=0)$, and/or that $X(i)=0$ if $p(X(i)=0) > p(X(i)=1)$. It should be understood that this example is illustrative, and should not be construed as being limiting in any way. Block 408 may be followed by block 410.

At block 410 (END), the computing device 102 can be configured to terminate the process 400. In some implementations of the process 400, the computing device 102 can be configured to output and/or store the set of beliefs instead of and/or in addition to decoding the cell threshold voltage level in accordance with the set of beliefs as described above with reference to block 408. As such, the process 400 and/or other processes can include exporting or saving the set of beliefs in a memory or other data storage device. As such, it can be appreciated that the set of beliefs for a particular memory 108 can be determined, used, and/or saved by the computing device 102. As such, the computing device 102 can be configured to decode cell voltage levels of cells 112 without executing the process 400, though this is not necessarily the case.

Figure 5:
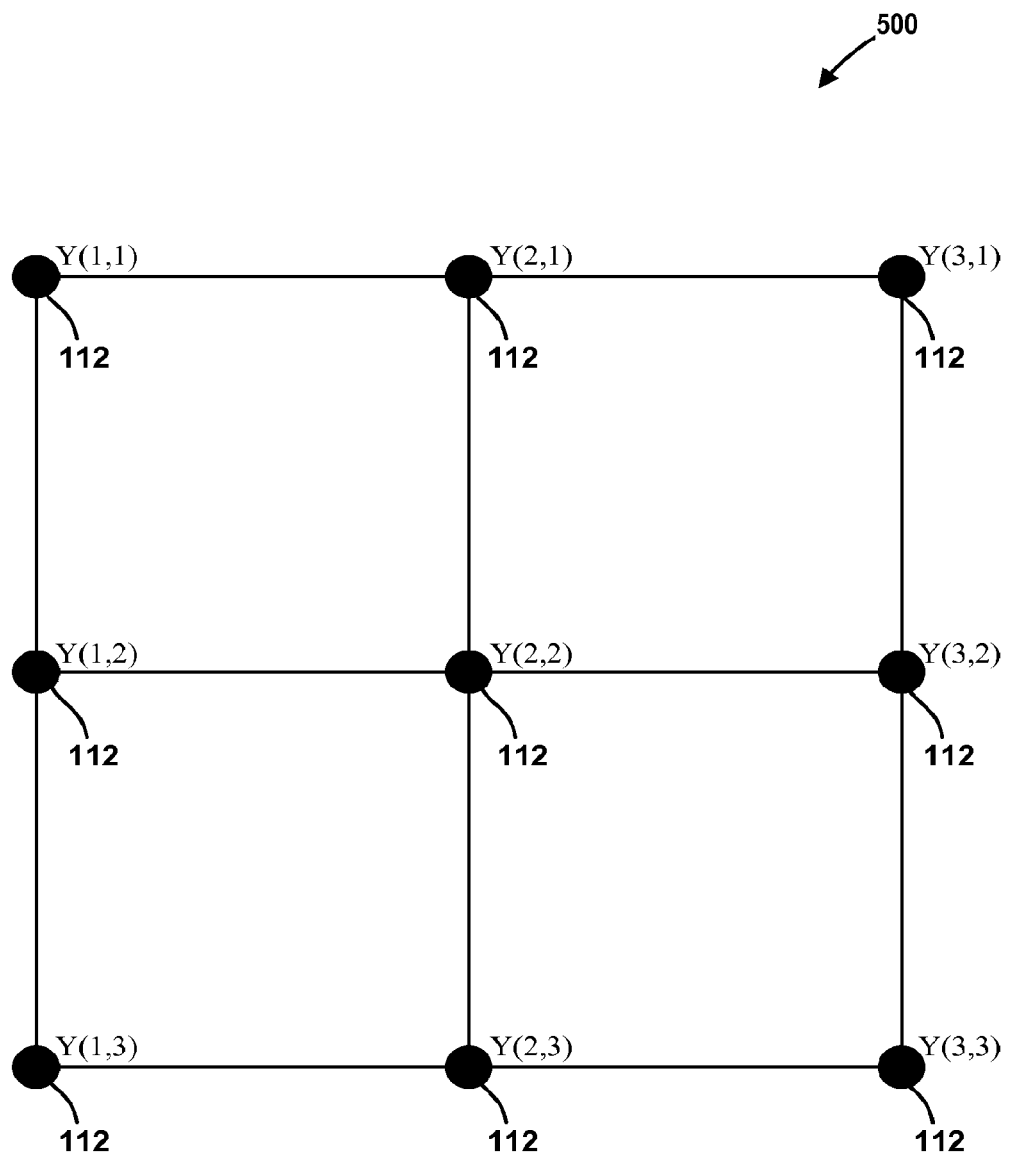
FIG. 5 is a line diagram illustrating additional aspects of the concepts and technologies disclosed herein for linear programming based decoding for memory devices.

Turning now to FIG. 5, a line diagram illustrating additional aspects of the concepts and technologies disclosed herein for linear programming based decoding for memory devices, arranged according to at least some embodiments presented herein, will be described. In particular, FIG. 5 illustrates an example array 500 of cells 112. The illustrated array 500 is provided for purposes of reference during description of an example of the concepts and technologies disclosed herein for linear programming based decoding. It should be clear that the example array 500 having nine cells 112 is illustrative, and that memory devices such as the memory 108 may have thousands, millions, or even billions of cells 112.

In the example illustrated herein with reference to FIG. 5, the notation $Y(i,j)$ is used to refer to the threshold voltage level of a cell 112 located at an i-th column and a j-th row of the array 500. Furthermore, the notation $X(i,j)$ is used herein to refer to a signal written to the cell 112 located at an i-th column and a j-th row of the array 500. For purposes of illustration only, the following example assumes interference from a cell 112 located at a neighboring upper row, and a cell 112 located at a left column. Thus, for example, a cell located at the second row and second column (2,2) can be assumed, for purposes of this example, to experience interference from the cells 112 (1,2) and (2,1) located in the first row and the first column, respectively. Because a particular read cell actually may experience interference from any number of neighboring cells 112, it should be understood that this example is illustrative, and should not be construed as being limiting in any way.

In this example, values of the cells 112 of the array 500 can be expressed as:

$Y(1,1)=X(1,1)$ $Y(2,1)=X(2,1)+x \times X(1,1)$ $Y(3,1)=X(3,1)+x \times X(2,1)$ $Y(1,2)=X(1,2)+y \times X(1,1)$ $Y(2,2)=X(2,2)+x \times X(1,2)+y \times X(2,1)$ $Y(3,2)=X(3,2)+x \times X(2,2)+y \times X(2,1)$ $Y(1,3)=X(1,3)+y \times X(1,2)$ $Y(2,3)=X(2,3)+x \times X(1,3)+y \times X(2,2)$ $Y(3,3)=X(3,3)+x \times X(2,3)+y \times X(3,2)$, wherein x and y can be values measured for a particular memory 108 of which the array 500 is a part. For purposes of illustrating this example, x and y will be assumed to be 0.2 and 0.3, respectively. As such, the above values can be expressed as:

$Y(1,1)=X(1,1)$ $Y(2,1)=X(2,1)+0.2 \times X(1,1)$ $Y(3,1)=X(3,1)+0.2 \times X(2,1)$ $Y(1,2)=X(1,2)+0.3 \times X(1,1)$ $Y(2,2)=X(2,2)+0.2 \times X(1,2)+0.3 \times X(2,1)$ $Y(3,2)=X(3,2)+0.2 \times X(2,2)+0.3 \times X(2,1)$ $Y(1,3)=X(1,3)+0.3 \times X(1,2)$ $Y(2,3)=X(2,3)+0.2 \times X(1,3)+0.3 \times X(2,2)$ $Y(3,3)=X(3,3)+0.2\times X(2,3)+0.3\times X(3,2)$ According to some embodiments, the interference can be determined by measuring the voltage levels Y(i,j) set forth above and comparing those to actual observed measurement values Z(i,j). For purposes of illustration, the following observed measurement values Z(i,j) are assumed:

$Z(1,1)=1.5$ $Z(1,2)=1.6$ $Z(1,3)=0.2$ $Z(2,1)=1.7$ $Z(2,2)=1.1$ $Z(2,3)=0.3$ $Z(3,1)=1.9$ $Z(3,2)=0.1$ $Z(3,3)=1.3$

In light of these measured values and the known interference pattern, the Euclidean distance relationship set forth herein can be expressed as $(Y(1,1)-Z(1,1))^2+(Y(2,1)-Z(2,1))^2+(Y(3,1)-Z(3,1))^2+(Y(1,2)-Z(1,2))^2+(Y(2,2)-Z(2,2))^2+(Y(3,2)-Z(3,2))^2+(Y(1,3)-Z(1,3))^2+(Y(2,3)-Z(2,3))^2+(Y(3,3)-Z(3,3))^2$. Using the known inter-cell interference model generated for this array 500 above, the Euclidean distance can be expressed as $(X(1,1)-Z(1,1))^2+(X(2,1)+0.2X(1,1)-Z(2,1))^2+(X(3,1)+0.2X(2,1)-Z(3,1))^2+(X(1,2)+0.3X(1,1)-Z(1,2))^2+(X(2,2)+0.2X(1,2)+0.3X(2,1)-Z(2,2))^2+(X(3,2)+0.2X(2,2)+0.3X(2,1)-Z(3,2))^2+(X(1,3)+0.3X(1,2)-Z(1,3))^2+(X(2,3)+0.2X(1,3)+0.3X(2,2)-Z(2,3))^2+(X(3,3)+0.2X(2,3)+0.3X(3,2)-Z(3,3))^2$.

Furthermore, the values of Z(i,j) determined above can be substituted in the above expression of the Euclidean distance to obtain $(X(1,1)-1.5)^2+(X(2,1)+0.2\times X(1,1)-1.7)^2+(X(3,1)+0.2\times X(2,1)-1.9)^2+(X(1,2)+0.3\times X(1,1)-1.6)^2+(X(2,2)+0.2\times X(1,2)+0.3\times X(2,1)-1.1)^2+(X(3,2)+0.2\times X(2,2)+0.3\times X(2,1)-0.1)^2+(X(1,3)+0.3\times X(1,2)-0.2)^2+(X(2,3)+0.2\times X(1,3)+0.3\times X(2,2)-0.3)^2+(X(3,3)+0.2\times X(2,3)+0.3\times X(3,2)-1.3)^2$. Furthermore, in some embodiments, quadratic terms of this expression can be expanded as $(X(1,1)-1.5)^2=X(1,1)^2-3X(1,1)+1.5^2=X(1,1)-3X(1,1)+2.25=-2X(1,1)+2.25$.

It can be appreciated with reference to FIG. 5 that $X(1,1)^2=X(1,1)$ because $X(1,1)$ can be equal to zero (0) or one (1). Similarly, the following equations can be obtained as:

(1) $(X(2,1)+0.2X(1,1)-1.7)^2=X(2,1)^2+0.2X(1,1)X(2,1)-1.7X(2,1)+0.2X(1,1)X(2,1)+0.04X(1,1)^2-0.34X(1,1)-1.7X(2,1)-0.34X(1,1)+1.7^2=X(2,1)+0.2X(1,1)X(2,1)-1.7X(2,1)+0.2X(1,1)X(2,1)+0.04X(1,1)-0.34X(1,1)-1.7X(2,1)-0.34X(1,1)+2.89=0.4X(1,1)X(2,1)-2.4X(2,1)-0.64X(1,1)+2.89$ (2) $(X(3,1)+0.2X(2,1)-1.9)^2=X(3,1)^2+0.2X(2,1)X(3,1)-1.9X(3,1)+0.2X(3,1)X(2,1)+0.04X(2,1)^2-0.38X(2,1)-1.9X(3,1)-0.38X(2,1)+1.9^2=X(3,1)+0.2X(2,1)X(3,1)-1.9X(3,1)+0.2X(3,1)X(2,1)+0.04X(2,1)-0.38X(2,1)-1.9X(3,1)+0.38X(2,1)+3.61=0.4X(2,1)X(3,1)-2.8X(3,1)-0.34X(2,1)+3.61$ (3) $(X(1,2)+0.3X(1,1)-1.6)^2=X(1,2)^2+0.3X(1,1)X(1,2)-1.6X(1,2)+0.3X(1,2)X(1,1)+0.09X(1,1)^2-0.8X(1,1)-1.6X(1,2)-0.48X(1,1)+1.6^2=X(1,2)+0.3X(1,1)X(1,2)-1.6X(1,2)+0.3X(1,2)X(1,1)+0.09X(1,1)-0.48X(1,1)-1.6X(1,2)-0.48X(1,1)+2.56=0.6X(1,1)X(1,2)-2.2X(1,2)-0.87X(1,1)+2.56$ (4) $(X(2,2)+0.2X(1,2)+0.3X(2,1)-1.1)^2=X(2,2)^2+0.2X(1,2)X(2,2)+0.3X(2,1)X(2,2)-1.1X(2,2)+0.2X(2,2)X(1,2)+0.04X(1,2)^2+0.06X(2,1)X(1,2)-0.22X(1,2)+0.3X(2,2)X(2,1)+0.06X(1,2)X(2,1)+0.09X(2,1)^2-0.33X(2,1)-1.1X(2,2)-0.22X(1,2)-0.33X(2,1)+1.21=X(2,2)+0.2X(1,2)X(2,2)+0.3X(2,1)X(2,2)-1.1X(2,2)+0.2X(2,2)X(1,2)+0.04X(1,2)+0.06X(2,1)X(1,2)-0.22X(1,2)+0.3X(2,2)X(2,1)+0.06X(1,2)X(2,1)+0.09X(2,1)-0.33X(2,1)-1.1X(2,2)-0.22X(1,2)-0.33X(2,1)+1.21=0.4X(1,2)X(2,2)+0.6X(2,1)X(2,2)+0.12X(2,1)X(1,2)-1.2X(2,2)-0.4X(1,2)-0.57X(2,1)+1.21$ (5) $(X(3,2)+0.2X(2,2)+0.3X(2,1)-0.1)^2=X(3,2)X(3,2)+0.2X(2,2)X(3,2)+0.3X(2,1)X(3,2)-0.1X(3,2)+0.2X(3,2)X(2,2)+0.04X(2,2)X(2,2)+0.06X(2,1)X(2,2)-0.02X(2,2)+0.3X(3,2)X(2,1)+0.06X(2,2)X(2,1)+0.09X(2,1)X(2,1)-0.03X(2,1)-0.1X(3,2)-0.02X(2,2)-0.03X(2,1)+0.01=X(3,2)+0.2X(2,2)X(3,2)+0.3X(2,1)X(3,2)-0.1X(3,2)+0.2X(3,2)X(2,2)+0.04X(2,2)+0.06X(2,1)X(2,2)-0.02X(2,2)+0.3X(3,2)X(2,1)+0.06X(2,2)X(2,1)+0.09X(2,1)-0.03X(2,1)-0.1X(3,2)-0.02X(2,2)-0.03X(2,1)+0.01=0.4X(2,2)X(3,2)+0.6X(2,1)X(3,2)+0.12X(2,1)X(2,2)+0.8X(3,2)+0.03X(2,1)+0.01$ (6) $(X(1,3)+0.3X(1,2)-0.2)^2=X(1,3)X(1,3)+0.3X(1,2)X(1,3)-0.2X(1,3)+0.3X(1,3)X(1,2)+0.09X(1,2)X(1,2)-0.06X(1,2)-0.2X(1,3)-0.06X(1,2)+0.04=X(1,3)+0.3X(1,2)X(1,3)-0.2X(1,3)+0.3X(1,3)X(1,2)+0.09X(1,2)-0.06X(1,2)-0.2X(1,3)-0.06X(1,2)+0.04=0.6X(1,2)X(1,3)+0.6X(1,3)-0.03X(1,2)+0.04$ (7) $(X(2,3)+0.2X(1,3)+0.3X(2,2)-0.3)^2=X(2,3)X(2,3)+0.2X(1,3)X(2,3)+0.3X(2,2)X(2,3)-0.3X(2,3)+0.2X(2,3)X(1,3)+0.04X(1,3)X(1,3)+0.06X(2,2)X(1,3)-0.06X(1,3)+0.3X(2,3)X(2,2)+0.06X(1,3)X(2,2)+0.09X(2,2)X(2,2)-0.09X(2,2)-0.3X(2,3)-0.06X(1,3)-0.09X(2,2)+0.09=X(2,3)+0.2X(1,3)X(2,3)+0.3X(2,2)X(2,3)-0.3X(2,3)+0.2X(2,3)X(1,3)+0.04X(1,3)+0.06X(2,2)X(1,3)-0.06X(1,3)+0.3X(2,3)X(2,2)+0.06X(1,3)X(2,2)+0.09X(2,2)-0.09X(2,2)-0.3X(2,3)-0.06X(1,3)-0.09X(2,2)+0.09=0.4X(1,3)X(2,3)+0.6X(2,2)X(2,3)+0.12X(2,2)X(1,3)+0.4X(2,3)-0.08X(1,3)-0.09X(2,2)+0.09$ (8) $(X(3,3)+0.2X(2,3)+0.3X(3,2)-1.3)^2=X(3,3)X(3,3)+0.2X(2,3)X(3,3)+0.3X(3,2)X(3,3)-1.3X(3,3)\ 0.2X(3,3)X(2,3)+0.04X(2,3)X(2,3)+0.06X(3,2)X(2,3)-0.26X(2,3)\ 0.3X(3,3)X(2,3)+0.06X(2,3)X(3,2)+0.09X(3,2)X(2,2)-0.39X(2,2)-1.3X(3,3)-0.26X(2,3)-0.39X(3,2)+1.69=X(3,3)+0.2X(2,3)X(3,3)+0.3X(3,2)X(3,3)-1.3X(3,3)+0.2X(3,3)X(2,3)+0.04X(2,3)+0.06X(3,2)X(2,3)-0.26X(2,3)+0.3X(3,3)X(2,2)+0.06X(2,3)X(2,2)+0.09X(3,2)-0.39X(2,2)-1.3X(3,3)-0.26X(2,3)-0.39X(3,2)+1.69=0.4X(2,3)X(3,3)+0.6X(3,2)X(3,3)+0.12X(3,2)X(2,3)-1.6X(3,3)-0.48X(2,3)-0.69X(3,2)+1.69$.

Substituting these equations into the Euclidean distance expression obtained above, the Euclidean distance can be expressed as $0.4X(1,1)X(2,1)+0.4X(2,1)X(3,1)+0.6X(1,1)X(1,2)+0.4X(1,2)X(2,2)+0.6X(2,1)X(2,2)+0.12X(2,1)X(1,2)+0.4X(2,2)X(3,2)+0.6X(1,2)X(3,2)+0.12X(2,1)X(2,2)+0.6X(1,2)X(1,3)+0.4X(1,3)X(2,3)+0.6X(2,2)X(2,3)+0.12X(2,2)X(2,3)+0.4X(2,3)X(3,3)+0.6X(3,2)X(3,3)+0.12X(3,2)X(2,3)-3.51X(1,1)-2.63X(1,2)-2.2X(2,1)-1.29X(2,2)-2.8X(3,1)+0.11X(3,2)+0.52X(1,3)-1.6X(3,3)-0.08X(2,3)+14.35$. Thus, an optimization problem can be formed by minimizing this expression subject to the constraints that X(i,j) is equal to zero (0) or one (1). Because such a problem may be difficult to solve, some probability distributions P over X(i,j) can be assumed to satisfy the constraints such as P(X(i,j)=0)+P(X(i,j)=1)=1 and P(X(i,j))=P(X(i,j),X(i',j')=0)+P(X(i,j),X(i',j')=1).

By modifying the objective function to the expectation of the Euclidean distance, and by recognizing linearity of the expectation, the expectation can be expressed as $\mathbb{E}[0.4X(1,1)X(2,1)]+\mathbb{E}[0.4X(2,1)X(3,1)]+\mathbb{E}[0.6X(1,1)X(1,2)]+\mathbb{E}[0.4X(1,2)X(2,2)]+\mathbb{E}[0.6X(2,1)X(2,2)]+\mathbb{E}[0.12X(2,1)X(1,2)]+\mathbb{E}[0.4X(2,2)X(3,2)]+\mathbb{E}[0.6X(2,1)X(3,2)]+\mathbb{E}[0.12X(2,1)X(2,2)]+\mathbb{E}[0.6X(1,2)X(1,3)]+\mathbb{E}[0.4X(1,3)X(2,3)]+\mathbb{E}[0.6X(2,2)X(2,3)]+\mathbb{E}[0.12X(2,2)X(1,3)]+\mathbb{E}[0.4X(2,3)X(3,3)]+\mathbb{E}[0.6X(3,2)X(3,3)]+\mathbb{E}[0.12X(3,2)X(2,3)]-\mathbb{E}[3.51X(1,1)]-\mathbb{E}[2.63X(1,2)]-\mathbb{E}[2.2X(2,1)]-\mathbb{E}[1.29X(2,2)]-\mathbb{E}[2.8X(3,1)]+\mathbb{E}[0.11X(3,2)]+\mathbb{E}[0.52X(1,3)]-\mathbb{E}[1.6X(3,3)]-\mathbb{E}[0.08X(2,3)]+14.35$. As such, each expectation can be evaluated by definition. For example, $\mathbb{E}[0.4X(1,1)X(2,1)]=0.4*P(X(1,1)=0,X(2,1)=0)*0*0+0.4*P(X(1,1)=0,X(2,1)=1)*0*1+0.4*P(X(1,1)=1,X(2,1)=0)*1*0+0.4*P(X(1,1)=1,X(2,1)=1)*1*1=0.4P(X(1,1)=1,X(2,1)=1)$. It should be understood that this example is illustrative, and should not be construed as being limiting in any way.

Figure 6:
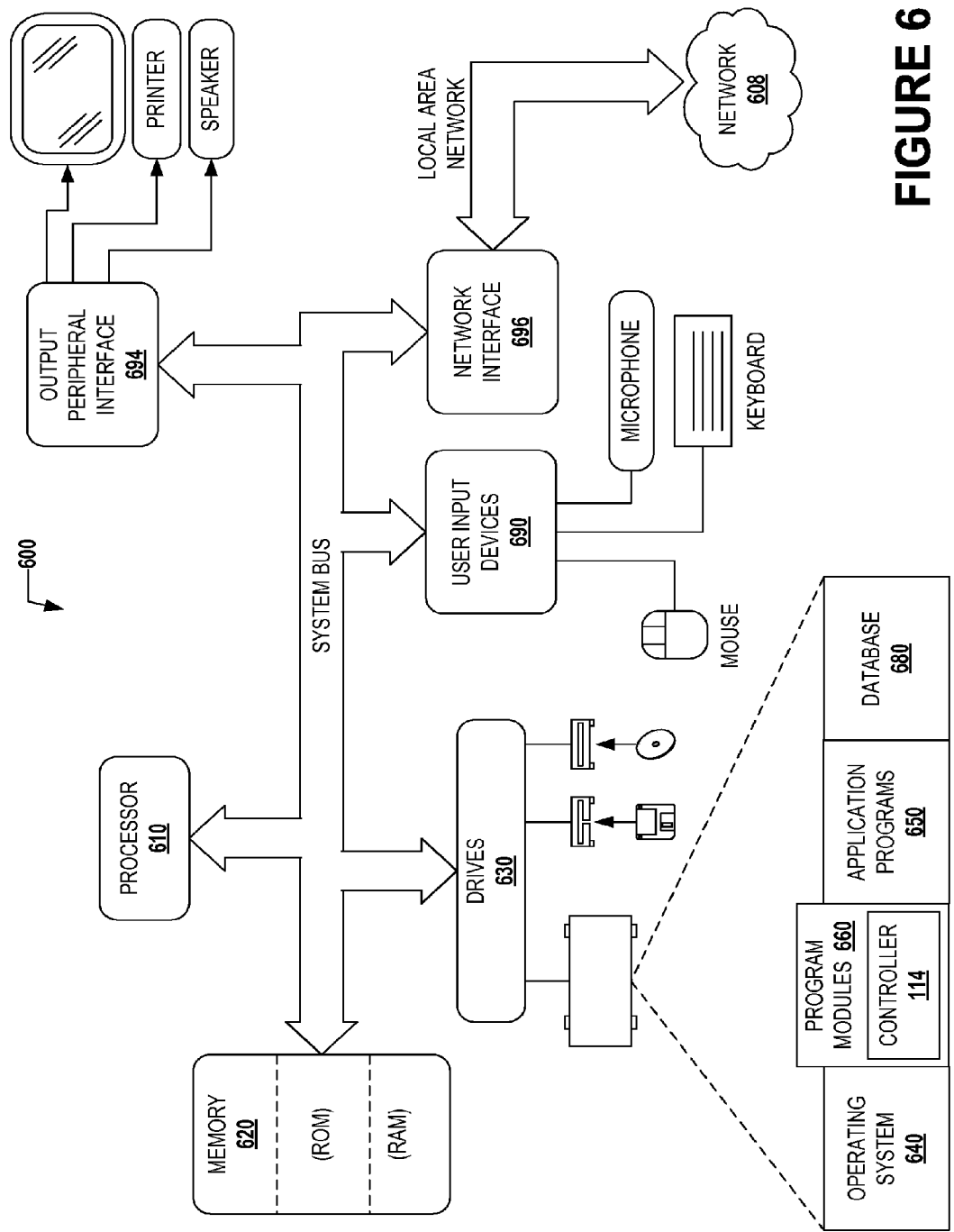
FIG. 6 is a block diagram illustrating an example computer capable of providing linear programming based decoding for memory devices.

FIG. 6 is a block diagram illustrating an example computer 600 capable of providing linear programming based decoding for memory devices arranged according to at least some embodiments presented herein. As depicted, the computer 600 includes a processor 610, a memory 620 and one or more drives 630. The computer 600 may be implemented as a conventional computer system, an embedded control computer system, a laptop computer, a server computer, a set-top box ("STB") or set-top unit ("STU"), a gaming console, a vehicle information system, a mobile telephone or smartphone, other computing systems, other hardware platforms, combinations thereof, or the like.

The drives 630 and their associated computer storage media, provide storage of computer readable instructions, data structures, program modules and other data for the computer 600. The drives 630 can include an operating system 640, application programs 650, program modules 660, and a database 680. The program modules 660 may include a controller, such as the controller 114. The controller 114 may be adapted to execute either or both of the processes 400 and/or 500 for linear programming based decoding for memory devices as described in greater detail above (e.g., see previous description with respect to one or more of FIGS. 4-5). The computer 600 further includes user input devices 690 through which a user may enter commands and data. The input devices 690 can include one or more of an electronic digitizer, a microphone, a keyboard and pointing device, commonly referred to as a mouse, trackball or touch pad. Other input devices may include a joystick, game pad, satellite dish, scanner, other devices, or the like.

These and other input devices can be coupled to the processor 610 through a user input interface that is coupled to a system bus, but may be coupled by other interface and bus structures, such as a parallel port, game port or a universal serial bus ("USB"). Computers such as the computer 600 also may include other peripheral output devices such as speakers, printers, displays, the data source 116, and/or other devices, which may be coupled through an output peripheral interface 694 or the like.

The computer 600 may operate in a networked environment using logical connections to one or more computers, such as a remote computer (not illustrated), the data source 116, and/or other devices operating as part of or in communication with a network 608 coupled to a network interface 696. The remote computer may be a personal computer, a server, a router, a network PC, a peer device or other common network node, and can include many or all of the elements described above relative to the computer 600. Networking environments are commonplace in offices, enterprise-wide area networks ("WAN"), local area networks ("LAN"), intranets, and the Internet.

When used in a LAN or WLAN networking environment, the computer 600 may be coupled to the LAN through the network interface 696 or an adapter. When used in a WAN networking environment, the computer 600 typically includes a modem or other means for establishing communications over the WAN, such as the Internet or the network 608. The WAN may include the Internet, the illustrated network 608, various other networks, or any combination thereof. It will be appreciated that other mechanisms of establishing a communications link, ring, mesh, bus, cloud, or network between the computers may be used.

According to some embodiments, the computer 600 may be coupled to a networking environment. The computer 600 may include one or more instances of a physical computer-readable storage medium or media associated with the drives 630 or other storage devices. The system bus may enable the processor 610 to read code and/or data to/from the computer storage media. The media may represent an apparatus in the form of storage elements that are implemented using any suitable technology, including but not limited to semiconductors, magnetic materials, optical media, electrical storage, electrochemical storage, or any other such storage technology. The media may represent components associated with memory 620, whether characterized as RAM, ROM, flash, or other types of volatile or nonvolatile memory technology. The media may also represent secondary storage, whether implemented as the storage drives 630 or otherwise. Hard drive implementations may be characterized as solid state, or may include rotating media storing magnetically-encoded information.

The storage media may include one or more program modules 660. The program modules 660 may include software instructions that, when loaded into the processor 610 and executed, transform a general-purpose computing system into a special-purpose computing system. As detailed throughout this description, the program modules 660 may provide various tools or techniques by which the computer 600 may participate within the overall systems or operating environments using the components, logic flows, and/or data structures discussed herein.

The processor 610 may be constructed from any number of transistors or other circuit elements, which may individually or collectively assume any number of states. More specifically, the processor 610 may operate as a state machine or finite-state machine. Such a machine may be transformed to a second machine, or specific machine by loading executable instructions contained within the program modules 660. These computer-executable instructions may transform the processor 610 by specifying how the processor 610 transitions between states, thereby transforming the transistors or other circuit elements constituting the processor 610 from a first machine to a second machine. The states of either machine may also be transformed by receiving input from the one or more user input devices 690, the network interface 696, other peripherals, other interfaces, or one or more users or other actors. Either machine may also transform states, or various physical characteristics of various output devices such as printers, speakers, video displays, or otherwise.

Encoding the program modules 660 may also transform the physical structure of the storage media. The specific transformation of physical structure may depend on various factors, in different implementations of this description. Examples of such factors may include, but are not limited to: the technology used to implement the storage media, whether the storage media are characterized as primary or secondary storage, or the like. For example, if the storage media are implemented as semiconductor-based memory, the program modules 660 may transform the physical state of the semiconductor memory 620 when the software is encoded therein. For example, the software may transform the state of transistors, capacitors, or other discrete circuit elements constituting the semiconductor memory 620.

As another example, the storage media may be implemented using magnetic or optical technology such as drives 630. In such implementations, the program modules 660 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. It should be appreciated that various other transformations of physical media are possible without departing from the scope and spirit of the present description. As used in the claims, the phrase "computer storage medium," and variations thereof, does not include waves, signals, and/or other transitory and/or intangible communication media, per se.

Figure 7:
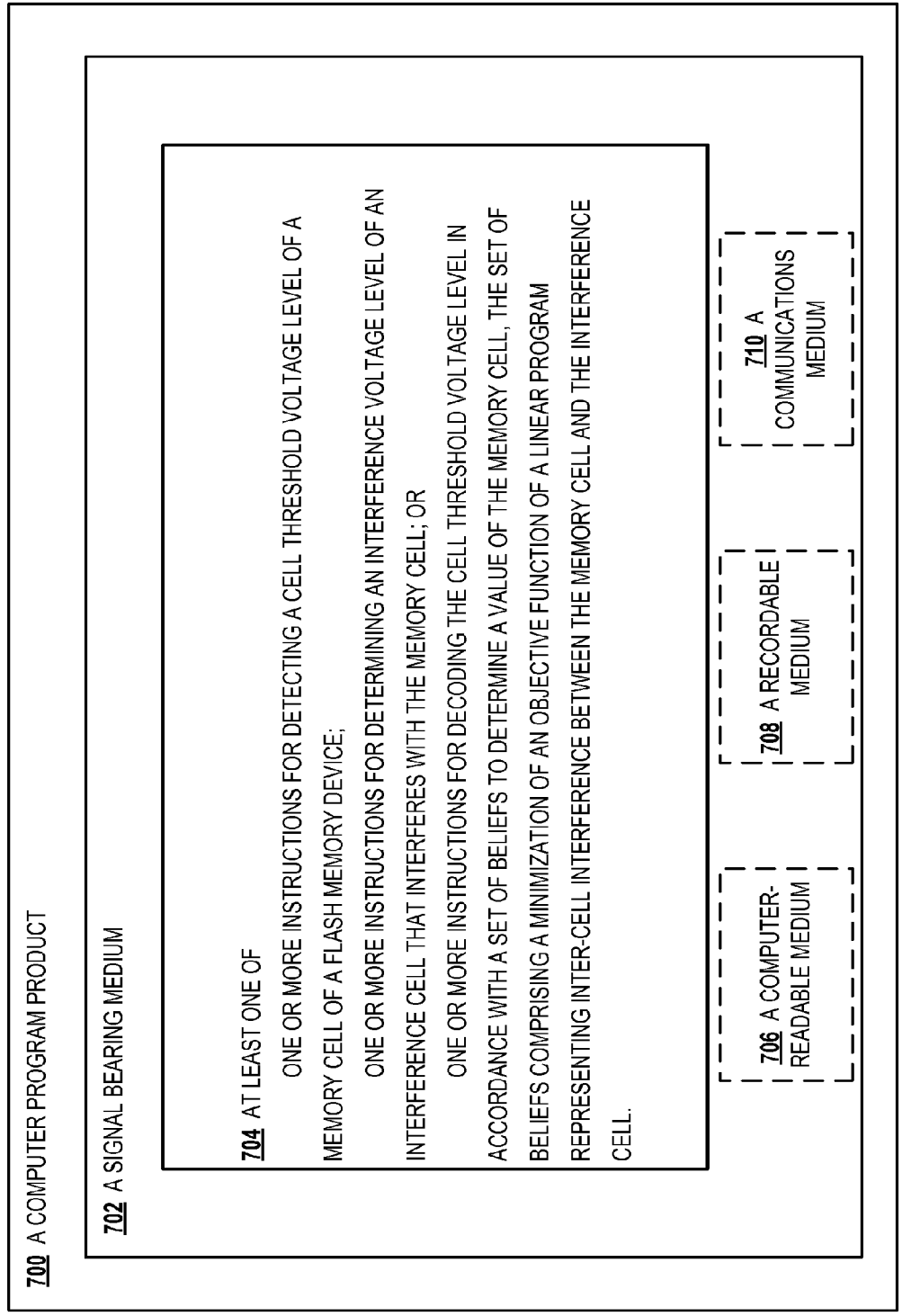
FIG. 7 is a schematic diagram illustrating computer program products for linear programming based decoding for memory devices, all arranged according to at least some embodiments presented herein.

FIG. 7 is a schematic diagram illustrating computer program products 700 for linear programming based decoding for memory devices arranged according to at least some embodiments presented herein. An illustrative embodiment of the example computer program product 700 is provided using a signal bearing medium 702, and may include at least one instruction 704. The at least one instruction 704 may include: one or more instructions for detecting a cell threshold voltage level of a memory cell of a flash memory device; one or more instructions for determining an interference voltage level of an interference cell that interferes with the memory cell; or one or more instructions for decoding the cell threshold voltage level in accordance with a set of beliefs to determine a value of the memory cell, the set of beliefs comprising a minimization of an objective function of a linear program representing inter-cell interference between the memory cell and the interference cell. In some embodiments, the signal bearing medium 702 of the one or more computer program products 700 include a computer readable medium 706, a recordable medium 708, and/or a communications medium 710.

While the subject matter described herein is presented in the general context of program modules that execute in conjunction with the execution of an operating system and application programs on a computer system, those skilled in the art will recognize that other implementations may be performed in combination with other types of program modules. Generally, program modules include routines, programs, components, data structures, and other types of structures that perform particular tasks or implement particular abstract data types. Moreover, those skilled in the art will appreciate that the subject matter described herein may be practiced with other computer system configurations, including hand-held devices, multi-core processor systems, microprocessor-based or programmable consumer electronics, minicomputers, mainframe computers, or the like.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. A method to determine a value of a memory cell of a flash memory device, the method comprising:
    detecting a cell threshold voltage level of the memory cell;
    determining an interference voltage level of an interference cell that interferes with the memory cell; and
    decoding the cell threshold voltage level in accordance with a set of probabilities to determine the value of the memory cell, the set of probabilities associated with a minimization of a linear program that represents inter-cell interference between the memory cell and the interference cell.

2. The method of claim 1, wherein the set of probabilities comprises marginal probabilities that satisfy a constraint associated with the linear program.

3. The method of claim 1, further comprising:
    receiving a model representing inter-cell interferences associated with a plurality of cells of the flash memory device, wherein the model comprises the set of probabilities.

4. The method of claim 1, wherein the set of probabilities is obtained by:
    modeling the inter-cell interference between the memory cell and the interference cell as an integer programming problem;
    relaxing the integer programming problem to obtain the linear program; and
    solving the linear program to obtain the set of probabilities.

5. The method of claim 1, further comprising:
    identifying, for a plurality of signals written to a plurality of cells of the flash memory device, measured threshold voltage levels and resulting threshold voltage values; and
    determining, based upon the resulting threshold values, a configuration used to write to the plurality of cells, wherein the configuration minimizes a Euclidean distance between the resulting threshold values and the measured threshold voltage levels.

6. The method of claim 5, further comprising:
    determining an integer programming problem that represents the Euclidean distance between the resulting threshold values and the measured threshold voltage levels;
    relaxing the integer programming problem to obtain a linear programming problem; and
    identifying the set of probabilities that correspond to marginal probabilities that minimizes the linear programming problem.

7. The method of claim 1, wherein detecting the cell threshold voltage level comprises detecting the cell threshold voltage level in response to receipt of a request to read the value of the memory cell.

8. The method of claim 1, wherein decoding the cell threshold voltage comprises:
    compensating for the inter-cell interference between the memory cell and the interference cell by multiplication of the cell threshold voltage level by a marginal probability that corresponds to at least one of the set of probabilities; and
    determining the value of the memory cell in accordance with a result of multiplication of the cell threshold voltage level by the marginal probability.

9. The method of claim 1, wherein decoding the cell threshold voltage level comprises:
    determining a probability that the value of the memory cell is equal to zero;
    determining a further probability that the value of the memory cell is equal to one;
    in response to a determination that the probability is greater than the further probability, determining the value of the memory cell is zero; and
    in response to a determination that the further probability is greater than the probability, determining the value of the memory cell is one.

10. A computer readable medium comprising computer executable instructions that, when executed by a computer, cause the computer to:
    detect a cell threshold voltage level of a memory cell of a flash memory device;
    determine an interference voltage level of an interference cell that interferes with the memory cell; and
    decode the cell threshold voltage level in accordance with a set of probabilities to determine a value of the memory cell, the set of probabilities comprising a minimization of a linear program that represents inter-cell interference between the memory cell and the interference cell.

11. The computer readable medium of claim 10, further comprising computer executable instructions that, when executed by the computer, cause the computer to:
    receive a model that represents inter-cell interferences between a plurality of cells of the flash memory device, wherein the model comprises the set of probabilities.

12. The computer readable medium of claim 10, wherein the set of probabilities comprises marginal probabilities that satisfies a constraint associated with the linear program.

13. The computer readable medium of claim 10, wherein to obtain the set of probabilities, the computer executable instructions, when executed by the computer, further cause the computer to:

model the inter-cell interference between the memory cell and the interference cell as an integer programming problem;
relax the integer programming problem to obtain the linear program; and
solve the linear program to obtain the set of probabilities.

14. The computer readable medium of claim 10, further comprising computer executable instructions that, when executed by the computer, further cause the computer to:
identify, for a plurality of signals written to a plurality of cells of the flash memory device, measured threshold voltage levels and resulting threshold voltage values; and
determine, based upon the resulting threshold voltage values, a configuration used to write to the plurality of cells, wherein the configuration minimizes a Euclidean distance between the resulting threshold voltage values and the measured threshold voltage levels.

15. The computer readable medium of claim 14, further comprising computer executable instructions that, when executed by the computer, further cause the computer to:
determine an integer programming problem that represents the Euclidean distance between the resulting threshold voltage values and the measured threshold voltage levels;
relax the integer programming problem to obtain a linear programming problem; and
identify the set of probabilities, wherein the set of probabilities corresponds to marginal probabilities that minimizes the linear programming problem.

16. The computer readable medium of claim 10, wherein to detect the cell threshold voltage level, the computer executable instructions, when executed by the computer, further cause the computer to detect the cell threshold voltage level in response to a request to read the value of the memory cell.

17. The computer readable medium of claim 10, wherein to decode the cell threshold voltage level, the computer executable instructions, when executed by the computer, further cause the computer to:
multiply the cell threshold voltage level by a marginal probability that corresponds to at least one of the set of probabilities to compensate for the inter-cell interference between the memory cell and the interference cell; and
determine the value of the memory cell in accordance with a result of multiplication of the cell threshold voltage level by the marginal probability.

18. The computer readable medium of claim 10, wherein to decode the cell threshold voltage level, the computer executable instructions, when executed by the computer, further cause the computer to:
determine a probability that the value of the memory cell is equal to zero;
determine a further probability that the value of the memory cell is equal to one;
in response to a determination that the probability is greater than the further probability, determine the value of the memory cell is zero; and
in response to a determination that the further probability is greater than the probability, determine the value of the memory cell is one.

19. A computing device, comprising:
a flash memory device comprising a plurality of cells; and
a processor coupled to the flash memory device and configured to execute non-transitory computer executable instructions to
receive a request to read a value of a memory cell of the flash memory device,
obtain a mathematical model that represents inter-cell interferences of the plurality of cells, wherein the model comprises a set of marginal probabilities that satisfy constraints associated with the mathematical model,
detect a cell threshold voltage level of the memory cell,
determine, based upon the mathematical model, an interference voltage level of an interference cell that interferes with the memory cell, and
decode the cell threshold voltage level in accordance with the set of marginal probabilities to determine the value of the memory cell, wherein the set of marginal probabilities comprises a minimization of a linear program representing the inter-cell interferences.

20. The computing device of claim 19, wherein the processor is further configured to execute the computer executable instructions to
generate the mathematical model as an integer programming problem,
relax the integer programming problem to obtain the linear program, and
solve the linear program to obtain the set of marginal probabilities that minimize the linear program.

21. The computing device of claim 19, wherein the processor is further configured to execute the computer executable instructions to
identify, for a plurality of signals written to the plurality of cells of the flash memory device, measured threshold voltage levels and resulting threshold voltage values,
determine, based upon the resulting threshold values, a configuration used to write to the plurality of cells, wherein the configuration minimizes a Euclidean distance between the resulting threshold voltage values and the measured threshold voltage levels, and
generate the mathematical model based, at least partially, upon the Euclidean distance.

22. The computing device of claim 21, wherein the processor is further configured to execute the computer executable instructions to
determine an integer programming problem that represents the Euclidean distance between the resulting threshold values and the measured threshold voltage levels,
relax the integer programming problem to obtain a linear programming problem, and
identify the set of marginal probabilities, wherein the set of marginal probabilities minimizes the linear programming problem.

* * * * *